United States Patent [19]

Gray

[11] 4,168,440
[45] Sep. 18, 1979

[54] LC SIMULATED FILTER WITH TRANSMISSION ZEROS

[75] Inventor: Paul R. Gray, Orinda, Calif.

[73] Assignee: Intel Corporation, Santa Clara, Calif.

[21] Appl. No.: 868,976

[22] Filed: Jan. 12, 1978

[51] Int. Cl.² .................................................. H03H 11/00
[52] U.S. Cl. .............................. 307/233 R; 333/214; 328/167
[58] Field of Search ........... 328/167; 333/80 R, 80 T; 330/107; 307/233 R

[56] References Cited

U.S. PATENT DOCUMENTS

| 3,513,401 | 5/1970 | Tokunaga | 328/167 |
| 3,716,729 | 2/1973 | Rollett | 307/295 |
| 3,749,942 | 7/1973 | Moses | 307/233 X |
| 3,831,103 | 8/1974 | Ruegg et al. | 328/167 X |
| 3,835,399 | 9/1974 | Holmes | 328/167 |
| 3,886,469 | 5/1975 | Rollett et al. | 330/107 |

*Primary Examiner*—John S. Heyman
*Attorney, Agent, or Firm*—Blakely, Sokoloff, Taylor & Zafman

[57] ABSTRACT

An active filter employing a plurality of integrators which may be fabricated as a metal-oxide-semiconductor (MOS) integrated circuit is described. S-plane zeros are obtained without additional active devices when compared to prior art filters without such zeros. The zeros result from resistive coupling between the integrators. Resistance ratios and capacitance ratios primarily determine the filter's characteristics rather than the absolute value of these elements. This permits the filter to be readily fabricated with existing MOS technology.

10 Claims, 12 Drawing Figures

LC SIMULATED FILTER WITH TRANSMISSION ZEROS

BACKGROUND OF THE INVENTION

1. Field of the Invention

The present invention relates to the field of simulated filters, particularly those which include S-plane zeros.

2. Prior Art

It is well-known to simulate RLC ladder networks with active circuit devices by interconnecting a plurality of integrators. The integrators are most often operational amplifiers employing feedback to provide the integration function. In practice, these filters cannot easily be realized as integrated circuits, but rather are generally hybrid circuits since precision components are needed in the feedback path.

The present invention provides unique coupling between the integrators in an LC simulated filter which results in transmission zeros in the filter's characteristics. This coupling consists of resistive coupling in the presently preferred embodiment, and thus the transmission zeros are obtained without additional active circuit components. Moreover, the disclosed circuit is realizable as an integrated circuit.

The prior art and the improvement of the present invention are described in greater detail in conjunction with the FIGURES.

SUMMARY OF THE INVENTION

An active filter having S-plane zeros along the $j\omega$ axis is described. The filter includes a first integrator and a plurality of second integrators. The output terminal of the first integrator is coupled to the input terminals of the second integrators. A summing means which provides electrical summing and distribution of signals is employed to couple the output terminals of the second plurality of integrators to the input of the first integrator. In this manner, the S-plane zeros are obtained without additional active circuit components.

BRIEF DESCRIPTION OF THE DRAWINGS

FIG. 5a is a schematic of the prior art LC filter of FIG. 3 redrawn for purposes of explanation.

FIG. 5b is a schematic which is the electrical equivalent of the circuit of FIG. 5a.

FIG. 5c is a schematic which is the electrical equivalent of the circuit of FIGS. 5a and 5b.

FIG. 6a is a schematic of the active filter of FIG. 4 redrawn for purposes of explanation.

FIG. 6b is a redrawn portion of the schematic of FIG. 6a used for purposes of explanation.

DETAILED DESCRIPTION OF THE INVENTION

An electrical filter employing active circuit devices which simulates a passive LC ladder network having S-plane zeros along the $j\omega$ axis is described. In the presently preferred embodiment, the filter is fabricated employing metal-oxide-semiconductor (MOS) technology as an integrated circuit. However, it will be obvious to one skilled in the art that the filter may be fabricated employing other technologies, including bipolar integrated circuit technology, or may be fabricated with discrete components or as a hybrid circuit. In the following description, well-known circuit components such as integrators and operational amplifiers are not described in detail in order not to obscure the present invention in unnecessary detail. In other instances, specific details of the presently preferred embodiment are provided. It will be obvious to one skilled in the art that these specific details need not be employed to practice the present invention.

Figure 1:
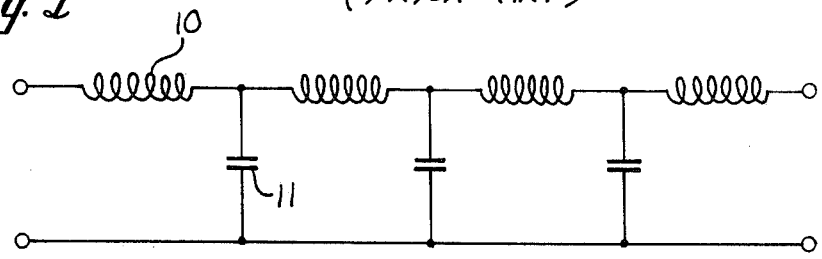
FIG. 1 is a schematic of a prior art LC filter.
Figure 2:
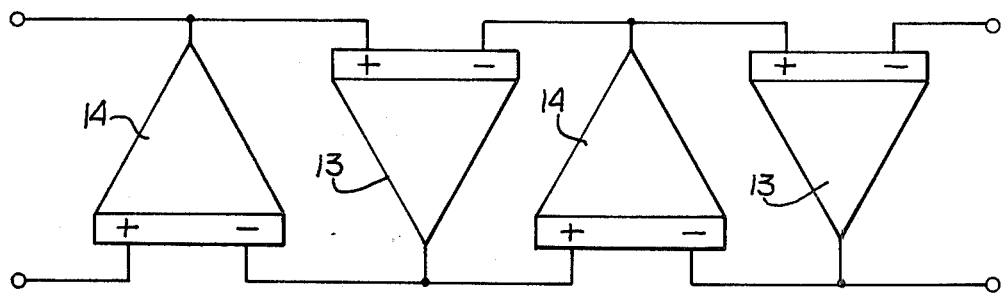
FIG. 2 is a schematic of an active network which simulates the filter of FIG. 1.

In FIG. 1 a plurality of sections of a well-known LC filter is illustrated. Each section of the filter comprises an inductor 10 and a capacitor 11. The filter of FIG. 1 may be simulated by an active circuit which includes a plurality of integrators. This active circuit is illustrated in FIG. 2 and includes a plurality of first integrators 13 and second integrators 14. The outputs of the first integrators 13 are coupled to the inputs of the second integrators 14, as illustrated. And similarly, the outputs of the second integrators 14 are coupled to the inputs of the first integrators 13. A detailed explanation of this active filter technology is discussed in *Active Filters For Integrated Circuits* by Heinlein and Holmes, Prentice Hall International, 1974, specifically see Page 412.

Figure 3:
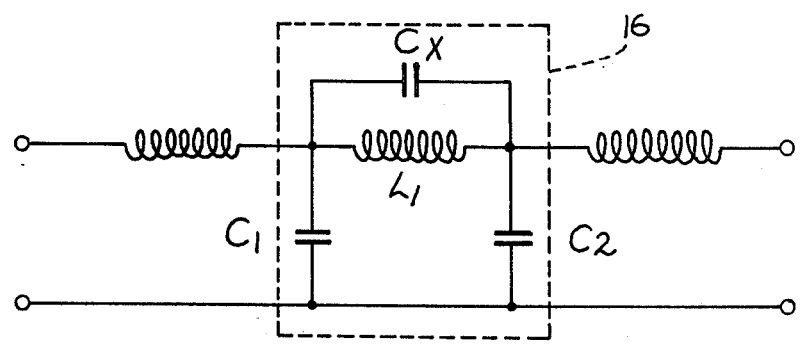
FIG. 3 is a schematic of a prior art LC filter which includes transmission zeros.

In numerous applications such as in the telecommunications field, filters having a sharper rolloff characteristic than those exhibited by the filters of FIGS. 1 and 2 are necessary. These characteristics are obtained from a circuit where the S-plane (where S is a complex variable) representation of the circuit includes zeros along the $j\omega$ axis. In practice, for an LC ladder network, these zeros are obtained by introducing capacitors such as capacitor $C_x$ of FIG. 3, across the inductors of the LC ladder network. In the prior art, to simulate the characteristics of the filter of FIG. 3, additional active circuit components are added to the circuit of FIG. 2. For example in the above referenced text, an active circuit for simulating the passive filter of FIG. 3 is shown on page 417, FIG. 8c. With the present invention, the circuit of FIG. 3 is simulated without any additional active circuit elements when compared to the circuit of FIG. 2.

Figure 4:
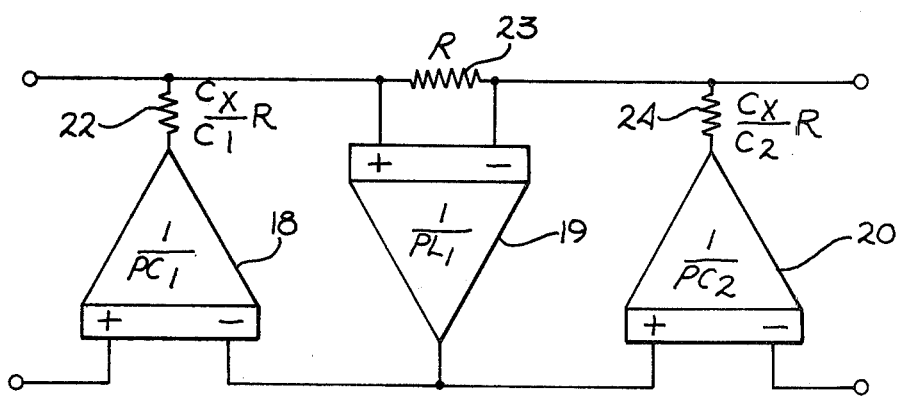
FIG. 4 is a schematic of an active circuit which simulates the filter of FIG. 3 built in accordance with the present invention.

The section of the filter of FIG. 3 shown within the dotted line 16 is realized with the circuit of FIG. 4. The circuit of FIG. 4 includes three integrators 18, 19 and 20. The output of integrator 18 is coupled through resistor 22 to one input terminal of the integrator 19. A resistor 23 is coupled between the two input terminals of the integrator 19. The output of the integrator 20 is coupled through resistor 24 to the other input terminal of the integrator 19. One input terminal of integrators 18 and 20 is coupled to the output terminal of the integrator 19. To duplicate the characteristics of the filter of FIG. 3, the integrators 18, 19 and 20 have the values $1/PC_1$, $1/PL_1$ and $1/PC_2$, respectively, where P is the integration operator. The resistor 22 has a resistance of $C_x/C_1 \times R$ where resistor 23 has the resistance R; resistor 24 has the resistance $C_x/C_2 \times R$. It should be noted that the resistance of resistor 23 is arbitrary and the resistance of the resistors 22 and 24 is defined by a ratio which includes $C_x$ in both cases. Thus, the absolute values of resistors 22, 23 and 24 are not critical. This allows the fabrication of the circuit of FIG. 4, as will be discussed in greater detail, as an integrated circuit.

Figure 5A:
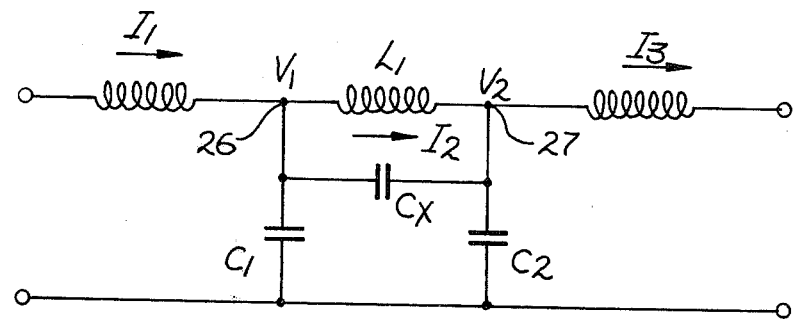
FIGS. 5a, 5b and 5c, and FIGS. 6a and 6b are used to show that the prior art filter of FIG. 3 is the equivalent of the filter of FIG. 4.

In order to show that the filter section 16 of FIG. 3 is simulated by the circuit of FIG. 4, the filter of FIG. 3 has been redrawn in FIG. 5a. In FIG. 5a, the capacitor $C_x$ has been drawn below the inductor $L_1$ in order to show the relative positions in the circuit of the three capacitors. Clearly, FIG. 5a is the equivalent of FIG. 3. In FIG. 5a, node 26 has been identified as $V_1$ and the current leaving into this node as $I_1$. The current leaving this node through the inductor $L_1$ is $I_2$. Also in FIG. 5a, node 27 has been assigned the potential $V_2$. The current leaving this node is $I_3$.

Figure 5B:
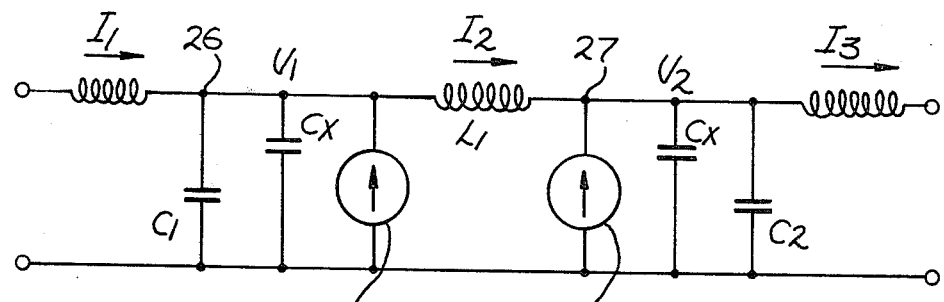

In examining FIG. 5a, it may be seen that current flows into node 26 through the capacitor $C_x$. The effects on this node from current through this capacitor may be substituted with the parallel combination of the capacitor $C_x$ and a current source having a value $C_x dV_2/dt$. This equivalency is shown in FIG. 5b. Similarly, in examination node 27 and the effects on this node from the capacitive coupling through $C_x$, a replacement may be made with the parallel combination of the capacitor $C_x$ and a current source $C_x dV_1/dt$ as shown in FIG. 5b. The capacitors $C_1$ and $C_x$ may be combined, and similarly, the capacitor $C_x$ and $C_2$ may be combined since they are in parallel. Now the parallel combination of a current source and an impedance may be replaced with a voltage source and a series impedance, as is well known. This equivalency is shown in FIG. 5c.

Figure 5C:
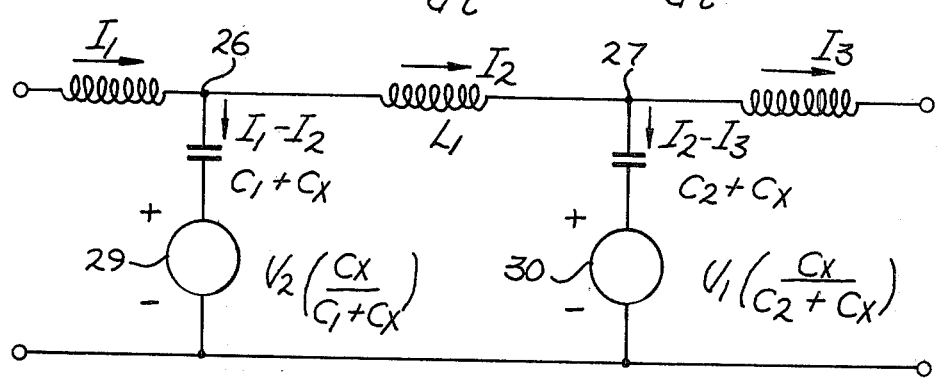

As indicated in FIG. 5c, the current flowing through the capacitor $C_1 + C_x$ is $I_1 - I_2$. This current, of course, also flows through the voltage source 29 connected in series with this capacitor. Similarly, the current flowing through the capacitor $C_2 + C_x$ is $I_2 - I_3$. It is now possible to write an equation for $V_1$ in terms of $V_2$ and the currents $I_1$ and $I_2$. The potential $V_1$ is equal to the voltage drop across the capacitor $C_1 + C_x$ and the voltage drop across the voltage source 29. $V_1$ thus may be expressed in terms of the following equation:

$$V_1 = \frac{1}{C_1 + C_x} \int (I_1 - I_2)dt + V_2 \left( \frac{C_x}{C_1 + C_x} \right) \quad (1)$$

In a similar manner the potential $V_2$ may be expressed in terms of the voltage drop across the capacitor $C_2 + C_x$ and the potential across the voltage source 30 as shown below in equation 2.

$$V_2 = \frac{1}{C_2 + C_x} \int (I_2 - I_3)dt + V_1 \left( \frac{C_x}{C_2 + C_x} \right) \quad (2)$$

Figure 6A:
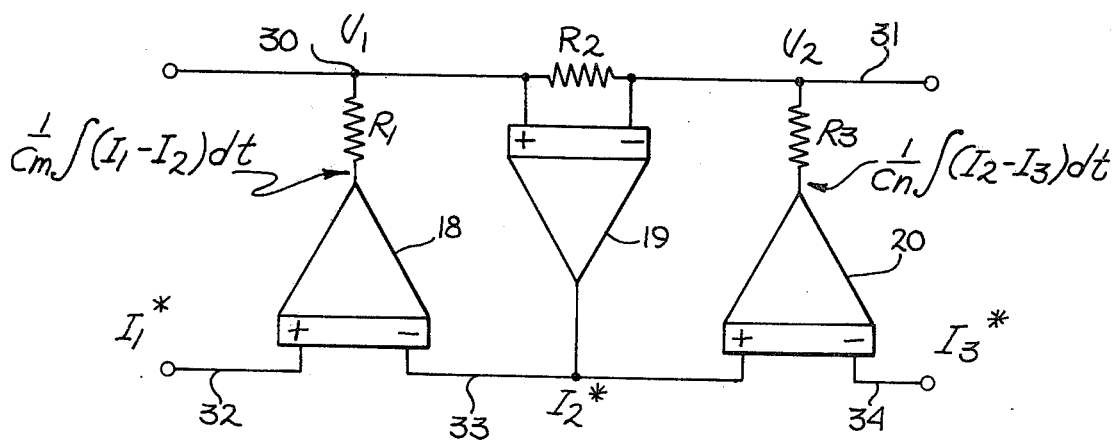

Now referring to FIG. 6a, the circuit of FIG. 4 has been redrawn with the resistors identified as $R_1$, $R_2$ and $R_3$. The input node to the filter section, node 30, has been labeled $V_1$ and the output node of the filter section, node 31, as $V_2$. For purposes of discussion assume that the potential on node 32 which is coupled to one input terminal of the integrator 18 is $I_1*$. The asteric is used to indicate that it is a voltage not a current. Similarly, a potential on node 33 has been identified as $I_3*$ and the potential on node 34 as $I_3*$. The output of the integrator 18 may be written as an integral of $I_1 - I_2$ as indicated in FIG. 6a. Also, the output of the integrator 20 may be written as an integral of $I_2 - I_3$ as indicated in FIG. 6a.

Figure 6B:
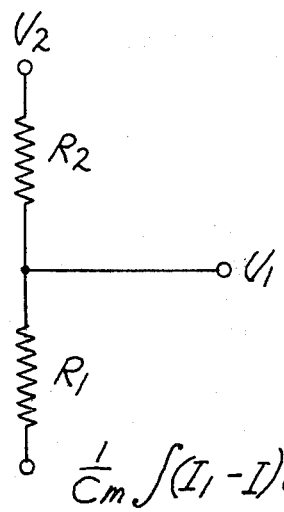

Comparing FIGS. 6a and 6b, the potential $V_1$ may be considered to be the potential which results from a voltage divider which includes the resistors $R_2$ and $R_1$. The potential $V_1$ from this voltage divider may be written as $$V_1 = \frac{R_1}{R_1 + R_2} \left[ \frac{1}{Cm} \int (I_1 - I_2)dt + V_2 \right] \quad (3)$$

Figure 6C:
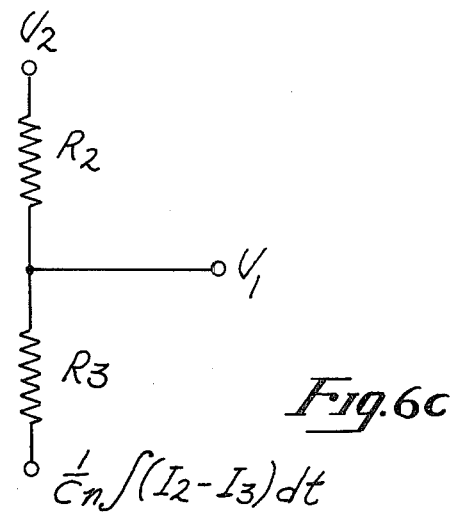
FIG. 6c is a redrawn portion of the schematic of FIG. 6a used for purposes of explanation.

Similarly, the voltage $V_2$ (FIG. 6c) may be considered to be the voltage which results from the voltage division of resistors $R_2$ and $R_3$. $V_2$ may thus be written as:

$$V_2 = \frac{R_3}{R_2 + R_3} \left[ \frac{1}{Cn} \int (I_2 - I_3)dt + V_1 \right] \quad (4)$$

Equations 3 and 4 may be rewritten as:

$$V_1 = \frac{R_1}{Cm(R_1 + R_2)} \int (I_1 - I_2)dt + V_2 \frac{R_1}{R_1 + R_2} \quad (5)$$

$$V_2 = \frac{R_3}{Cn(R_2 + R_3)} \int (I_2 - I_3)dt + V_1 \frac{R_3}{R_2 + R_3} \quad (6)$$

It is now apparent that equations 1 and 2 which represent the LC filter of FIG. 3 are of the same general form as equations 5 and 6, respectively, which equations represent the circuit of FIG. 4. By completing the algebra, it may be readily seen that the values shown in FIG. 4 for the resistors 22, 23 and 24 are correct when expressed in terms of the values in the passive LC filter of FIG. 3.

Figure 7:
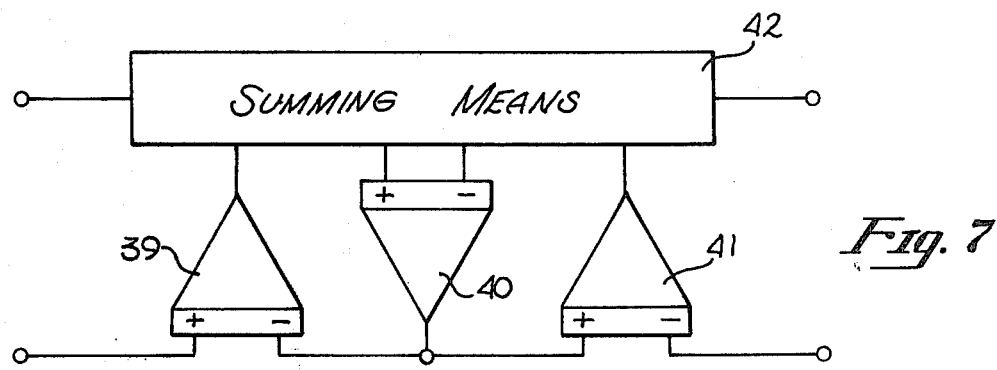
FIG. 7 is a block diagram used to illustrate the principle of the present invention.

In FIG. 7, the filter section of FIGS. 4 and 6a is again shown, however, in a more general form. The filter section of FIG. 7 again includes a first integrator 40 and second integrators 39 and 41. The second integrators 39 and 41 have their output terminals coupled to a summing means 42. The input terminals of the integrator 40 are coupled to the summing means 42. The output terminal of the first integrator 40 is coupled to one input terminal of each of the integrators 39 and 41 as is the case with the embodiment of FIGS. 4 and 6a. The summing means 42 may be the three resistors shown in FIG. 6a and in the presently preferred embodiment comprises a passive resistor network. However, it will be obvious to one skilled in the art that the summing means 42 may take on other embodiments, for example, it may include additional resistors for providing the same or similar voltage distribution as do the resistors 22, 23 and 24 of FIG. 4.

Figure 8:
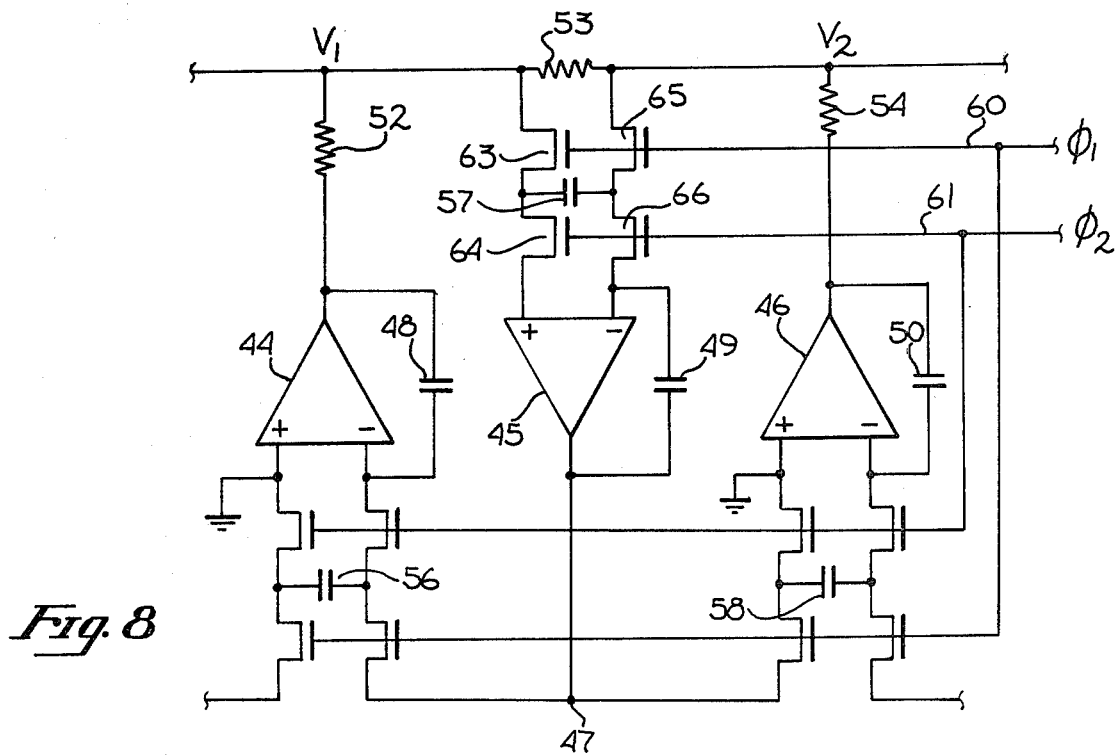
FIG. 8 is a schematic of one section of a filter built in accordance with the presently preferred embodiment of the present invention.

Referring now to FIG. 8, the circuit of FIG. 4 is shown in its presently preferred embodiment. This circuit is fabricated on a p-type monocrystalline silicon substrate employing n-channel field-effect devices. As presently implemented, polycrystalline silicon (polysilicon) gates are employed for the transistors; polysilicon layers are employed to fabricate the capacitors. The resistors 52, 53 and 54 are polysilicon resistors in the presently preferred embodiment.

The integrators 18, 19 and 20 of FIG. 4 are realized as operational amplifiers 44, 45 and 46 with feedback in FIG. 8. Each of the amplifiers has its negative input terminal coupled to its output through a capacitor, shown as capacitors 48, 49 and 50. The resistors 22, 23 and 24 of FIG. 4 are shown as resistors 52, 53 and 54, respectively in FIG. 8. The output terminal of the operational amplifier 45, node 47, is coupled to the negative input terminal of amplifier 44 and to the positive input terminal of the amplifier 46. A capacitor is disposed across the input terminals of each of the operational amplifiers. Specifically, capacitor 56 is coupled across the input terminals of the amplifier 44, and similarly, capacitor 57 is coupled across resistor 53, and capacitor 58 across the input terminals of the amplifier 46.

A plurality of switches are employed in conjunction with each of the capacitors 56, 57 and 58. Specifically, referring to capacitor 57, one terminal of this capacitor is coupled to the common junction between the transistors 63 and 64. These two transistors are coupled between one terminal of the resistor 53 and the positive input terminal of amplifier 45. The other terminal of the capacitor 57 is coupled to the common junction between the transistors 65 and 66. These transistors are coupled between the other terminal of resistor 53 and the negative input terminal of the amplifier 45. The gates of the transistors 63 and 65 are coupled to line 60 which receives the timing signal $\phi_1$ while the gates of the transistors 64 and 66 are coupled to line 61 which receives the timing signal $\phi_2$. The timing signals $\phi_1$ and $\phi_2$ are complementary signals which alternately activate the transistors coupled to these lines. Thus, by way of example, the capacitor 57 is first coupled across the resistor 53 and then coupled across the input terminals of the amplifier 45. The capacitors 56 and 58 are coupled to their respective amplifiers in the same manner and their respective switching means also receives the $\phi_1$ and $\phi_2$ timing signals on lines 60 and 61, respectively.

As is apparent from FIG. 8 each of the operational amplifiers includes a pair of capacitors, for example, the capacitors 48 and 56 which are associated with the amplifier 44. Typically, in order to convert an operational amplifier into an integrator, a precision resistor is required to provide feedback between the output terminal of the amplifier and one of its input terminals. It would, on first examination, appear that the capacitive feedback provided by capacitor 48 would not convert the amplifier 44 into the necessary integrator. However, because of the high frequency switching caused by the timing signals $\phi_1$ and $\phi_2$, the feedback appears to be feedback from a resistor. The amount of this feedback is not dependent upon the absolute values of the capacitor 48 but rather the ratio of capacitors 48 and 56. This "switched capacitor" technique is described in detail in "MOS Sample Data Switch-Capacitor Recursive Filters Using State Variable Techniques," a paper which was presented at the International Conference on Circuits and Systems, Phoenix, Ariz., March 1977 and written by Hosticka, Brodersen and Gray of the Department of Electrical Engineering and Computer Sciences and the Electronics Research Lab., University of California, Berkeley, Calif. This switched capacitor technique provides reduced circuit complexity, low sensitive due to coefficient variations and efficient utilization of silicon area.

In the presently preferred embodiment, a plurality of cascaded filter sections such as the one shown in FIG. 8 are fabricated on the same substrate to provide the required characteristics.

Thus, a circuit has been described which permits the simulation of passive LC filters, the S-plane representation of which includes zeros along the $j\omega$ axis. The disclosed circuit provides these transmission zeros without requiring additional active devices when compared to prior art circuits without such zeros. The disclosed circuit may be implemented as an integrated circuit with MOS technology.

I claim:

1. An active electrical filter section, the characteristics of which include S-plane zeros comprising:
   at least one first integrator having an output terminal and an input terminal;
   a pair of second integrators, each having an output terminal and an input terminal, said output terminal of said first integrator coupled to said input terminals of said second integrators;
   summing means for summing and distributing electrical signals, said summing means coupled to said output terminals of said second integrators and to said input terminal of said first integrator so as to provide S-plane zeros;
   whereby S-plane zeros may be realized without additional active circuit components.

2. The filter section defined by claim 1 wherein said summing means comprises a plurality of resistors.

3. The filter section defined by claim 2 wherein each of said integrators includes an operational amplifier.

4. The filter section defined by claim 3 wherein each of said integrators also includes capacitors and MOS switches such that said operational amplifiers perform as integrators.

5. A second for an active filter comprising:
   a first integrator having an input and output terminal;
   a second integrator having a pair of input terminals and an output terminal said output terminal coupled to said input terminal of said first integrator;
   a first resistor coupled to said output of said first integrator and to one of said input terminals of said second integrator;
   a second resistor coupled between said input terminals of said second integrator;
   a third integrator having an input terminal and an output terminal, said output terminal of said integrator coupled to said input of said third integrator;
   a third resistor coupled to the other of said input terminals of said second integrator and to said input of said third integrator;
   whereby a filter section with an S-plane zero on the $j\omega$ axis is realized with a minimum of active devices.

6. The filter sections defined by claim 5 wherein each of said first, second, and third integrators include an operational amplifier.

7. The filter section defined by claim 6 wherein each of said operational amplifiers include capacitive feedback.

8. The filter section defined by claim 7 including capacitors coupled between input terminals of each of said operational amplifiers.

9. The filter section defined by claim 8 including switches disposed in the lines leading to said input terminals of said operational amplifiers.

10. The filter section defined by claim 9 wherein said switches comprise MOS devices.

* * * * *

UNITED STATES PATENT AND TRADEMARK OFFICE
CERTIFICATE OF CORRECTION

PATENT NO. : 4,168,440
DATED : September 18, 1979
INVENTOR(S) : PAUL R. GRAY

It is certified that error appears in the above–identified patent and that said Letters Patent are hereby corrected as shown below:

| COLUMN | LINE | DESCRIPTION |
|---|---|---|
| 3 | 50 | $"V_1 = \frac{1}{C_1+C_x} (I_1=I_2)dt+V_2\left(\frac{C_x}{C_1+C_x}\right)"$ should be $--V_1 = \frac{1}{C_1+C_x}\int (I_1-I_2)dt+V_2\left(\frac{C_x}{C_1+C_x}\right)--$ |
| 3 | 60 | $"V_2 = \frac{1}{C_2+C_x}(I_2-I_3)dt+V_1\left(\frac{C_x}{C_2+C_x}\right)"$ should be $--V_2 = \frac{1}{C_2+C_x}\int (I_2-I_3)dt+V_1\left(\frac{C_x}{C_2+C_x}\right)--$ |

UNITED STATES PATENT AND TRADEMARK OFFICE
CERTIFICATE OF CORRECTION

PATENT NO. : 4,168,440

DATED : September 18, 1979

INVENTOR(S) : PAUL R. GRAY

It is certified that error appears in the above-identified patent and that said Letters Patent are hereby corrected as shown below:

| COLUMN | LINE | DESCRIPTION |
|---|---|---|
| 4 | 15 | $"V_1 = \dfrac{R_1}{R_1+R_2} \left[ \dfrac{1}{Cm} (I_1-I_2)dt + V_2 \right]"$ | should be $$--V_1 = \dfrac{R_1}{R_1+R_2} \left[ \dfrac{1}{Cm} \int (I_1-I_2)\,dt + V_2 \right] --$$

| | | |
|---|---|---|
| 4 | 25 | $"V_2 = \dfrac{R_3}{R_2+R_3} \left[ \dfrac{1}{Cn} (I_2-I_3)dt + V_1 \right]"$ | should be $$--V_2 = \dfrac{R_3}{R_2+R_3} \left[ \dfrac{1}{Cn} \int (I_2-I_3)\,dt + V_1 \right] --$$

| | | |
|---|---|---|
| 4 | 30 | $"V_1 = \dfrac{R_1}{Cm(R_1+R_2)} \, (I_1-I_2)dt + V_2 \, \dfrac{R_1}{R_1+R_2} "$ | should be $$--V_1 = \dfrac{R_1}{Cm(R_1+R_2)} \int (I_1-I_2)\,dt + V_2 \, \dfrac{R_1}{R_1+R_2} --$$

UNITED STATES PATENT AND TRADEMARK OFFICE
CERTIFICATE OF CORRECTION

PATENT NO. : 4,168,440

DATED : September 18, 1979

INVENTOR(S) : PAUL R. GRAY

It is certified that error appears in the above-identified patent and that said Letters Patent are hereby corrected as shown below:

| COLUMN | LINE | DESCRIPTION |
|---|---|---|
| 4 | 34 | $"V_2 = \frac{R_3}{Cn(R_2+R_3)} (I_2-I_3)dt+V_1 \frac{R_3}{R_2+R_3}"$ should be $--V_2 = \frac{R_3}{Cn(R_2+R_3)} \int (I_2-I_3)dt+V_1 \frac{R_3}{R_2+R_3} --$ |
| 6 | 36 | "second" should be --section--. |

Signed and Sealed this

Twenty-eighth Day of February 1984

[SEAL]

Attest:

Attesting Officer

GERALD J. MOSSINGHOFF

Commissioner of Patents and Trademarks